(12) United States Patent
Adiga-Manoor et al.

(10) Patent No.: US 8,624,213 B2
(45) Date of Patent: Jan. 7, 2014

(54) OPTOCOUPLER CIRCUIT FOR GATE DRIVER

(75) Inventors: Shreesha Adiga-Manoor, York, PA (US); Harold R. Schnetzka, Simpsonville, SC (US)

(73) Assignee: Johnson Controls Technology Company, Holland, MI (US)

( * ) Notice: Subject to any disclaimer, the term of this patent is extended or adjusted under 35 U.S.C. 154(b) by 9 days.

(21) Appl. No.: 13/520,469

(22) PCT Filed: Jan. 12, 2011

(86) PCT No.: PCT/US2011/020915
§ 371 (c)(1),
(2), (4) Date: Jul. 3, 2012

(87) PCT Pub. No.: WO2011/090853
PCT Pub. Date: Jul. 28, 2011

(65) Prior Publication Data
US 2012/0298890 A1  Nov. 29, 2012

Related U.S. Application Data

(60) Provisional application No. 61/296,220, filed on Jan. 19, 2010.

(51) Int. Cl.
*G02B 27/00* (2006.01)
*H02H 1/04* (2006.01)
*H02H 9/08* (2006.01)

(52) U.S. Cl.
USPC .......................... 250/551; 361/93.9; 361/111

(58) Field of Classification Search
USPC ................... 250/551, 214 R, 214 C, 214 SW; 361/110, 111, 93.9
See application file for complete search history.

(56) References Cited

U.S. PATENT DOCUMENTS

| | | | | |
|---|---|---|---|---|
| 5,892,673 A | * | 4/1999 | Delgado et al. | 363/98 |
| 5,982,640 A | * | 11/1999 | Naveed et al. | 363/21.15 |
| 7,808,759 B2 | * | 10/2010 | Baumgartner | 361/93.9 |
| 7,919,781 B2 | * | 4/2011 | Wang et al. | 257/82 |
| 8,116,055 B2 | * | 2/2012 | Baumgartner et al. | 361/93.9 |
| 2005/0139791 A1 | | 6/2005 | Breinlinger | |
| 2008/0308817 A1 | | 12/2008 | Wang et al. | |
| 2008/0316668 A1 | | 12/2008 | Baumgartner | |
| 2012/0298890 A1 | * | 11/2012 | Adiga-Manoor et al. | 250/551 |

FOREIGN PATENT DOCUMENTS

GB    2351621 A    1/2001

* cited by examiner

*Primary Examiner* — John Lee
(74) *Attorney, Agent, or Firm* — McNees Wallace & Nurick LLC

(57) ABSTRACT

An optocoupler circuit includes a switch connected in parallel with a photo LED, the photo LED having an anode and a cathode. The anode is connected to a power supply via a decoupling capacitor. The optocoupler circuit is arranged so that the switch turns on the photo LED when in the open position. When closed, the switch directs current flow through a series resistor to ground and shunts current flow away from the photo LED to turn off the photo LED. A second capacitor is connected to the cathode of the photo LED. The second capacitor is wired in series with a second switch and a current limiting resistor connected to ground. The first switch and second switch operate in complementary states to prevent the cathode connected capacitor from discharging. The disclosed optocoupler circuit provides the ability to function at increased levels of common mode voltage transients.

20 Claims, 3 Drawing Sheets

OPTOCOUPLER CIRCUIT FOR GATE DRIVER

CROSS-REFERENCE TO RELATED APPLICATIONS

This application claims priority from and the benefit of U.S. Provisional Patent Application No. 61/296,220, filed Jan. 19, 2010, entitled "OPTOCOUPLER CIRCUIT FOR GATE DRIVER", which is hereby incorporated by reference.

BACKGROUND

The application generally relates to using an optocoupler in applications having high voltage and/or high power circuits. The application relates more specifically to a system and method for using optocouplers to provide electrical isolation in gate driver circuits or boards in variable speed drives, where large common mode voltage transients occur between the input and output of the optocoupler.

An optocoupler includes a photo light-emitting diode (LED) and a photo-detector, or phototransistor between the LED and photo-detector. The optocoupler can be used for isolating two circuits. When an optocoupler is used in gate driver applications for high voltage and/or high power circuits, the isolating sides of the optocoupler may be exposed to high voltage, common mode transients.

An optocoupler has a common mode immunity rating that may be in the range of tens of kilovolts per microsecond (KV/μs). If common mode voltage transients exceed the common mode immunity rating, the optocoupler may fail. Optocoupler failure may result in the photo LED being switched on or off unintentionally. In sensitive applications, for example, a gate driver of a variable speed drive (VSD), unintentional switching of an optocoupler may result in a destructive shoot-through of the DC link voltage through the gated insulated gate bipolar transistor (IGBT).

In an optocoupler, the photo LED and photo-detector are not uncoupled electrically. Capacitive coupling may occur between the photo LED and the photo-detector. The coupling capacitance may be represented as a capacitor connected between each of the anode and cathode of the photo LED, and the output of the optocoupler. Thus, a large transient in the common mode voltage can result in current flowing to or from the anode or the cathode of the photo LED. The additional current due to common mode voltage transients can cause a photo LED to malfunction, e.g., to unintentionally turn on or off the photo detector.

Intended advantages of the disclosed systems and/or methods satisfy one or more of these needs or provide other advantageous features. Other features and advantages will be made apparent from the present specification. The teachings disclosed extend to those embodiments that fall within the scope of the claims, regardless of whether they accomplish one or more of the aforementioned needs.

SUMMARY

The present invention is directed to an optocoupler circuit. The optocoupler circuit is arranged to minimize accidental turn on or turn off of the photo light-emitting diode (LED). The optocoupler circuit includes a first switch connected in parallel to the photo LED. The anode of the photo LED is connected to the power supply, and the photo LED is activated when the first switch is open. The cathode of the photo LED is connected to ground through a first resistor. The cathode of the photo LED is also connected in series with a second switch, a second capacitor and a second resistor to ground. The first switch and the second switch are arranged to operate in complementary states to prevent the second capacitor from discharging.

The present invention is also directed to a gate driver circuit including a complementary switches integrated circuit and an optocoupler circuit. The optocoupler circuit includes a first switch connected in parallel to the photo light-emitting diode (LED). The anode of the photo LED is connected to the power supply, and the photo LED is activated when the first switch is open. The cathode of the photo LED is connected to ground through a first resistor. The cathode of the photo LED is also connected in series with a second switch, a second capacitor and a second resistor. The first switch and the second switch are arranged to operate in complementary states to prevent the second capacitor from discharging.

Further, an optocoupler circuit includes a switch connected in parallel with a photo LED, the photo LED having an anode and a cathode. The anode is connected to a power supply via a decoupling capacitor. The optocoupler circuit is arranged so that the switch turns on the photo LED when in the open position. When closed, the switch directs current flow through a series resistor to ground and shunts current flow away from the photo LED to turn off the photo LED. A second capacitor is connected to the cathode. The second capacitor is wired in series with a second switch and a current limiting resistor connected to ground. The first switch and second switch operate in complementary states to prevent the cathode connected capacitor from discharging.

One advantage of the embodiments described herein is that optocouplers may be operated beyond their rated common mode immunity range.

Another advantage of the embodiments described herein is the replacement of fiber-optic devices with optocouplers.

DETAILED DESCRIPTION OF THE EXEMPLARY EMBODIMENTS

Figure 1:
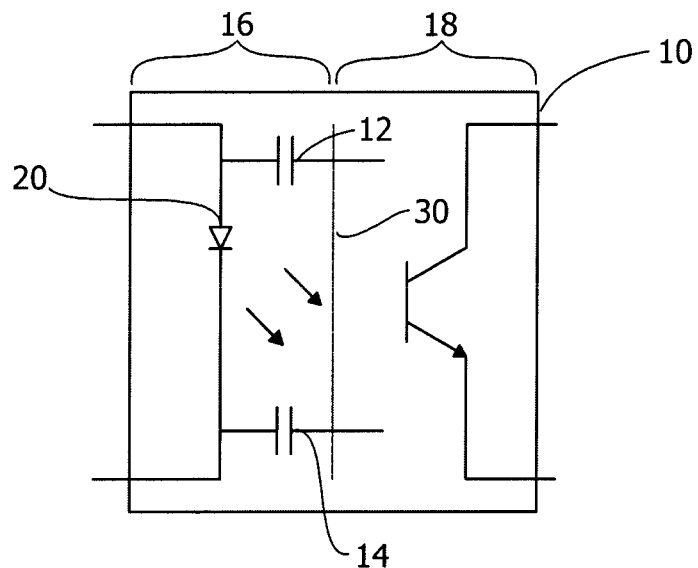
FIG. 1 shows an exemplary embodiment of an optocoupler circuit.

FIG. 1 shows a schematic diagram of an optocoupler circuit 10 which includes a photo LED 20. Optocoupler circuit 10 may be represented as including parasitic capacitors 12, 14 connected between the input section 16 of optocoupler circuit 10, and the output section 18 of optocoupler circuit 10. Line 30 represents an isolation barrier over which there is no electrical contact.

Figure 2:
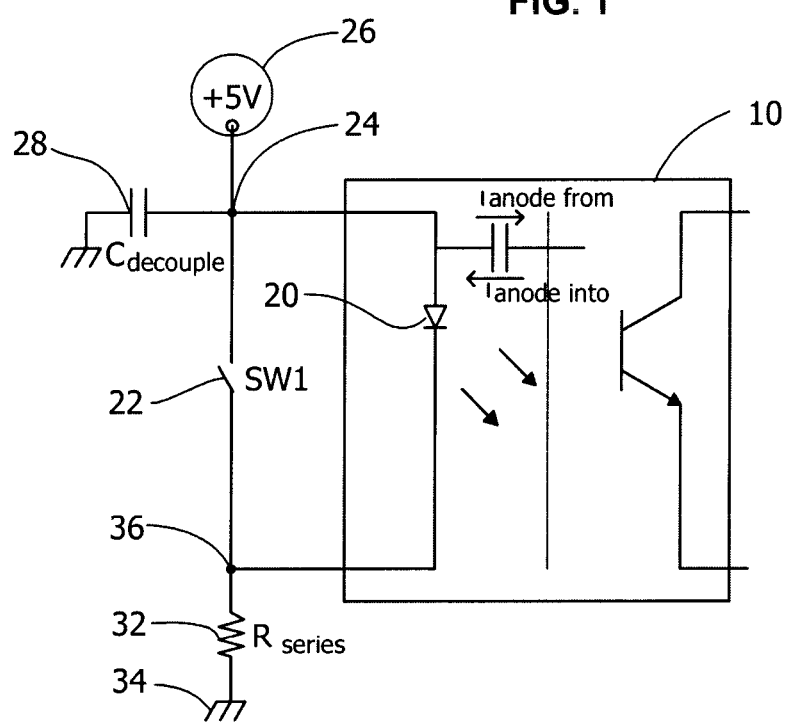
FIG. 2 shows an optocoupler circuit identifying current into/from the anode terminal due to input-output voltage transients.

Referring next to FIG. 2, optocoupler circuit 10 may be controlled by a switch (SW1) 22 connected in parallel with photo LED 20. In one embodiment, using switch 22 to control photo LED 20 provides immunity and/or protection from common mode transients when switch 22 is connected in parallel with photo LED 20. Optocoupler circuit 10 includes an anode 24 of photo LED 20 connected to a power supply 26 via a decoupling capacitor 28 ($C_{decoupler}$). In one embodiment, decoupling capacitor 28 may have a capacitance of about 0.1 micro-farads (µf). Opening switch 22 causes current to flow into photo LED 20 and the series resistor 32 to ground 34, switching photo LED 20 into an active or "on" state. Closing switch 22 causes current to flow through the switch 22 and the series resistor 32 ($R_{series}$) to ground 34, and shunts current flow away from photo LED 20, thus, switching photo LED 20 to the off state. In one embodiment, series resistor 32 may have a resistance value of about 169 ohms, although higher or lower resistance values may be used for series resistor 32, provided that the current is directed through series resistor 32 rather than through photo LED 20.

Any current induced into anode 24 due to excessive common mode voltage transients are provided a direct path to power supply 26 and decoupling capacitor 28, whether switch 22 is in either the on or off state. Accidental activation or deactivation of photo LED 20 is thus prevented.

Figure 3:
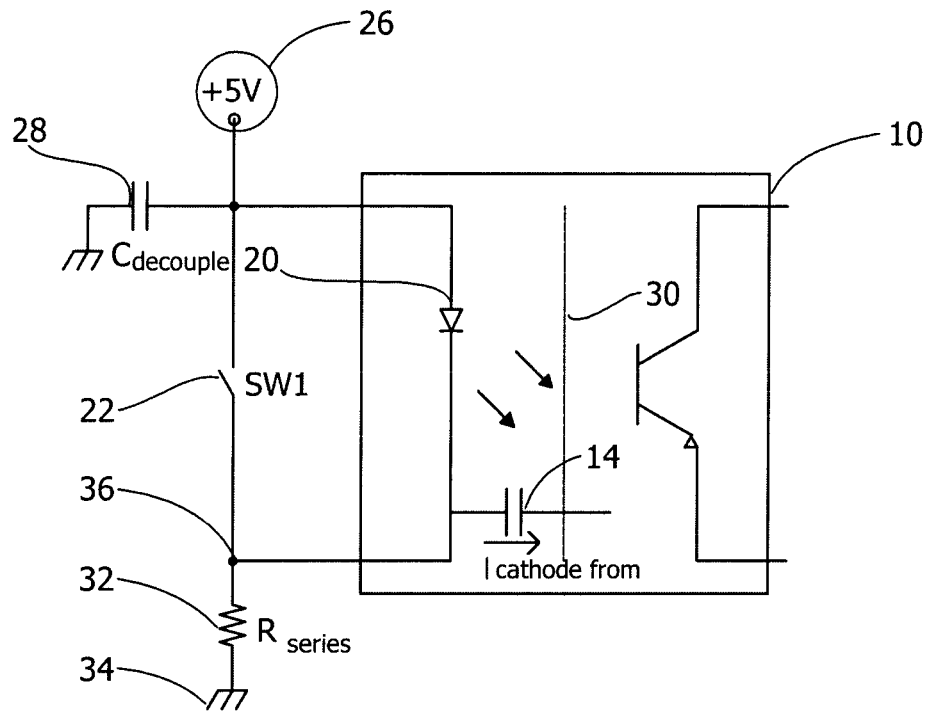
FIG. 3 shows an optocoupler circuit with the photo LED in the on state and current drawn from the cathode terminal due to input-output voltage transients.

Any current induced into cathode 36 due to excessive common mode voltage transients can cause the optocoupler 10 to malfunction. The optocoupler circuit 10 may be analyzed under two different circumstances, one where current flows into the cathode 36 and the other when the current flows out of the cathode 36 of the photo LED 20. Referring to FIG. 3, voltage transients induce current $I_{cathode\_from}$ from cathode 36 of photo LED 20. If switch 22 is open, photo LED 20 is in the conductive state and current is flowing through photo LED 20. Current $I_{cathode\_from}$ flowing from cathode 36 through coupling capacitor 14 can add current to photo LED 20, which is the already in the conductive state. Thus, current $I_{cathode\_from}$ flowing from cathode 36 through coupling capacitor 14 cannot cause false triggering of optocoupler circuit 10. If, however, switch 22 is in the closed state, current $I_{cathode\_from}$ drawn from cathode 36 of the photo LED can flow through switch 22. Switch 22 may have resistance in a range of a few hundred milliohms, which is common in electrical switches. Because of the low resistance value of the closed switch 22, the current flowing from cathode 36 has to be large for photo LED 20 to be activated by $I_{cathode\_from}$. In other words, the voltage drop across switch 22 caused by $I_{cathode\_from}$ has to be as high as the forward bias voltage $V_F$ of the photo LED 20, in order for photo LED 20 to be unintentionally activated. The current through parasitic input-output capacitor 14 has to be extremely high, e.g., in the range of a few amperes, for an optocoupler circuit to false trigger, i.e., for the switch 22 to drop a voltage as high as $V_F$ of the photo LED 20. Typical values for parasitic input-output capacitance of optocouplers are in the pF range. Thus, the common mode voltage transient may have to be in the range of thousands of KV/µs for an accidental false triggering of photo LED 20 to occur.

Figure 4:
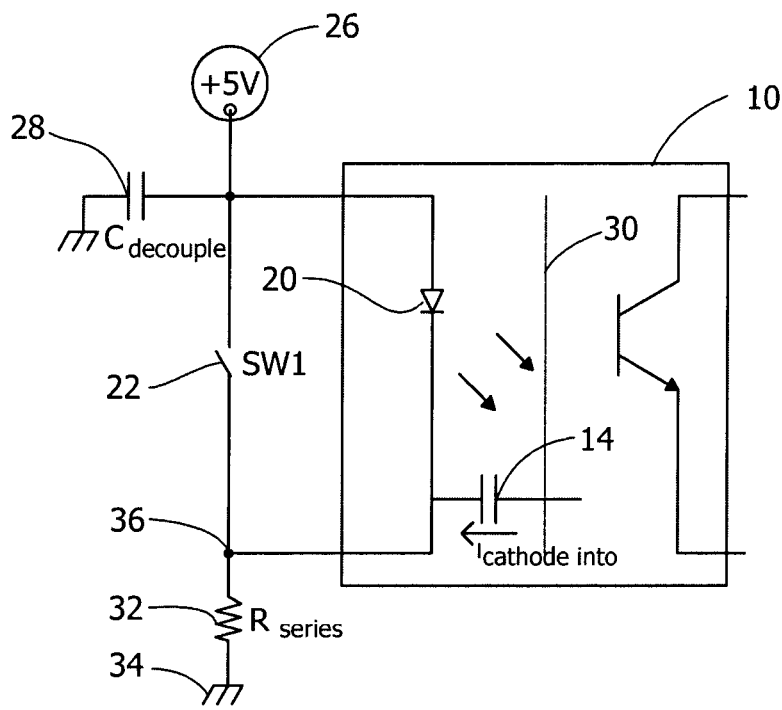
FIG. 4 shows an optocoupler circuit with the photo LED in the on state and current flowing into cathode terminal due to input-output voltage transients.

FIG. 4 shows voltage transients inducing a current $I_{cathode\_into}$ flowing into cathode 36 of photo LED 20. Current $I_{cathode\_into}$ flows an into the series resistor 32 and adds to the voltage drop across series resistor 32 to decrease the voltage drop across the photo LED 20 and may cause photo LED 20 to turn off. Thus, there may be a tendency for photo LED 20 in an on state to switch to an off state unintentionally. For example, an increase in voltage drop in a range of a few tenths of a volt across the series resistor 32 can cause the photo LED to turn off unintentionally. Current through parasitic input-output capacitor 14 in the range of a few milliamperes can cause this additional voltage drop to occur across series resistor 32. A typical value of parasitic input-output capacitance of optocouplers is in a range of a few pico-farads (pF). A relatively small common mode voltage transient, e.g., a few KV/µs, can result in milliamperes of current and cause an accidental turnoff of a turned on photo LED 20. The situation of current flowing into cathode 36 of photo LED 20 when photo LED is turned on is of concern as relatively small common mode voltage transients can cause the optocoupler 10 to malfunction. If switch 22 is closed, current flowing into cathode 36 of photo LED 20 can flow through switch 22 and into decoupling capacitor 28. The voltage drop across switch 22 induced by $I_{cathode\_into}$ can increase the reverse bias voltage on photo LED 20, and hence cannot affect the turned off state of photo LED 20.

Figure 5:
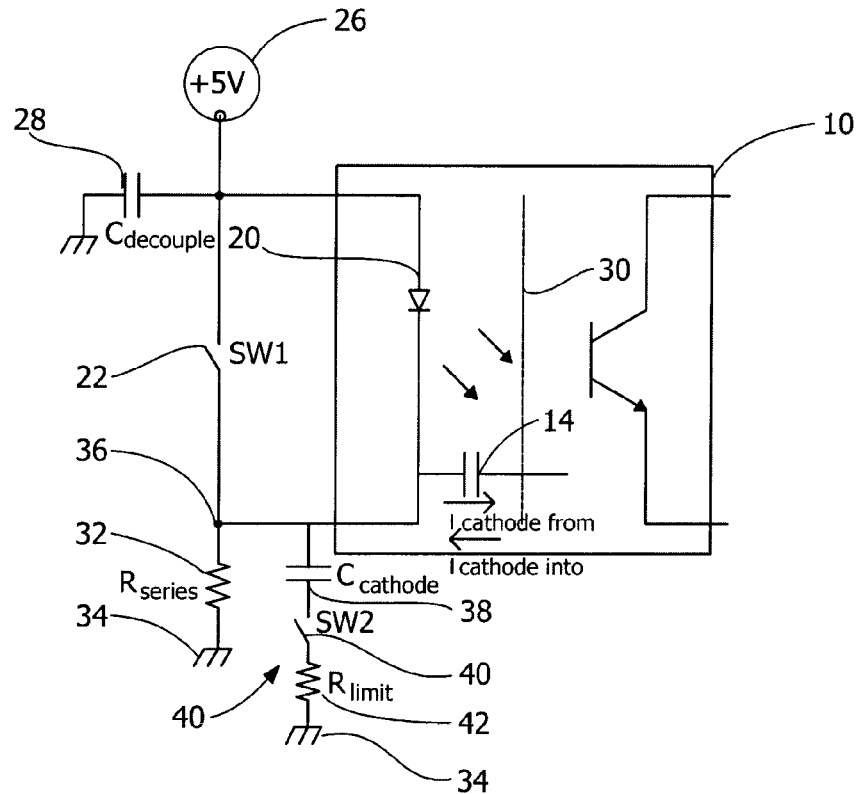
FIG. 5 shows an alternate embodiment of an optocoupler circuit with the photo LED in the on state and current flowing into/from the cathode terminal due to input-output voltage transients.

FIG. 5 shows an embodiment of an optocoupler circuit 10 that provides additional or increased immunity or protection from common mode voltage transients. A second capacitor, or cathode capacitor 38 ($C_{Cathode}$) is connected to the cathode 36 of the photo LED 20. Capacitor 38 is wired in series with a second switch 40 (SW2) and a current limiting resistor 42 ($R_{limit}$) connected to ground 34. In one exemplary embodiment, cathode capacitor 38 may have a capacitance value of about 0.1 micro-farad (µf), and current limiting resistor 42 may have a resistance value of about 15 ohm (Ω). The use of capacitor 38, second switch 40 and current limiting resistor 42 can prevent unintentional turnoff for an optocoupler circuit 10 due to common mode voltage transients.

In order to increase common mode immunity of the optocoupler circuit 10 when photo LED 20 is on, cathode capacitor 38 cannot be connected directly between cathode terminal 36 of the photo LED 20 and ground 34, as it would repeatedly charge and discharge every time the photo LED switches state. Cathode capacitor 38 is only required when photo LED 20 is in the on state and switch 22 is open. Hence cathode capacitor 38 is connected in series with a switch 40 that operates complementary to switch 22, i.e., switch 40 is open when switch 22 is closed (photo LED is off), and switch 40 is closed when switch 22 is open (photo LED is on), thereby preventing the capacitor from discharging. Switches 22, 40 may be any type of mechanical or electronic switch. In at least one embodiment switches 22, 40 may be a complementary transistor pair which has a common input and interconnections such that one transistor is on when the other is off, and vice versa.

The additional switched R-C series circuit, i.e., cathode capacitor 38 and limiting resistor 42 can be used when switch 40 is closed. During the first switching event, switch 22 is in an open position and switch 40 in a closed position. Cathode capacitor 38 charges during an initial activation of photo LED 20. To limit the peak current that can flow through photo LED 20 and cathode capacitor 38 during the initial charge, limiting resistor 42 is connected in series with cathode capacitor 38 and ground 34. If switches 22, 40 are not break-before-make type switches, then limiting resistor 42 may have a resistance value selected to limit the peak current through switches 22, 40 to a desired level. The charging of cathode capacitor 38 initially may result in peak current in the photo LED 20, which may cause photo LED 20 to malfunction or fail. The resistance value of resistor 42 should be selected to limit the peak current in photo LED 20 within specified ratings of photo LED 20. After cathode capacitor 38 charges, cathode capacitor 38 can remain charged. Thereafter, current flow through photo LED 20 is determined by series resistor 32. In one embodiment, cathode capacitor 38 may be a capacitor with low leakage current.

When switch 22 is open, a current $I_{cathode\_from}$ flows from power supply 26, decoupling capacitor 28 and cathode capacitor 38 through the parasitic capacitor 14. Current flowing from cathode capacitor 38 would be minimal as most of the current would be drawn from power supply 26 and capacitor 28 through the activated photo LED 20, since photo LED 20 provides a path with the least impedance. The common mode immunity in this case will be unaffected by series R-C circuit 44, and optocoupler circuit 10 will retain high common mode transient immunity ratings.

In the opposite case, current $I_{cathode\_into}$ is flowing into cathode terminal 36 from parasitic capacitance 14. Optocoupler circuit 10 includes photo LED 20 activated by switch 22 when open, with current flowing into cathode 36. Optocoupler circuits shown in FIGS. 2 through 4 had lower immunity from common mode voltage transients when current $I_{cathode\_into}$ flowed into cathode 36—i.e., any current flowing into cathode 36 of the photo LED 20 would have flowed through series resistor 32 and increased the voltage drop across it, potentially causing photo LED 20 to turn off. In that case, a common mode voltage transient of a few KV/μs could have cause accidental turnoff of photo LED 20.

With the addition of series R-C circuit 44, current flowing into cathode 36 of the photo LED has two paths to ground 34, one path through series resistor 32 and another path through series R-C circuit 44, i.e., cathode capacitor 38, switch 40 and limiting resistor 42. Most of the current flows through series R-C circuit 44, the path with lower impedance defined by cathode capacitor 38, switch 40 and limiting resistor 42. Series R-C circuit 44 can have a characteristic impedance that is about $\frac{1}{100}^{th}$ that of series resistor 32. Thus, series R-C circuit 44 connected in parallel with series resistor 32 as shown in FIG. 5 will require a $I_{cathode\_into}$ current about 100 times greater than the current $I_{cathode\_into}$ for the original circuit FIGS. 2-4, in order to generate the same voltage drop to cause a malfunction. Thus, the optocoupler circuit 10 of FIG. 5 provides immunity from common mode voltage transients that are about 100 times greater than the circuits shown in FIGS. 2-4. Optocoupler circuit 10 with series R-C circuit 44 connected between cathode 36 and ground 34 thus provides improved common mode transient immunity, an increase from several KV/μs to several hundreds of KV/μs.

Series R-C circuit 44 thus provides optocoupler circuit 10 the ability to function at increased levels of common mode voltage transients.

Figure 6:
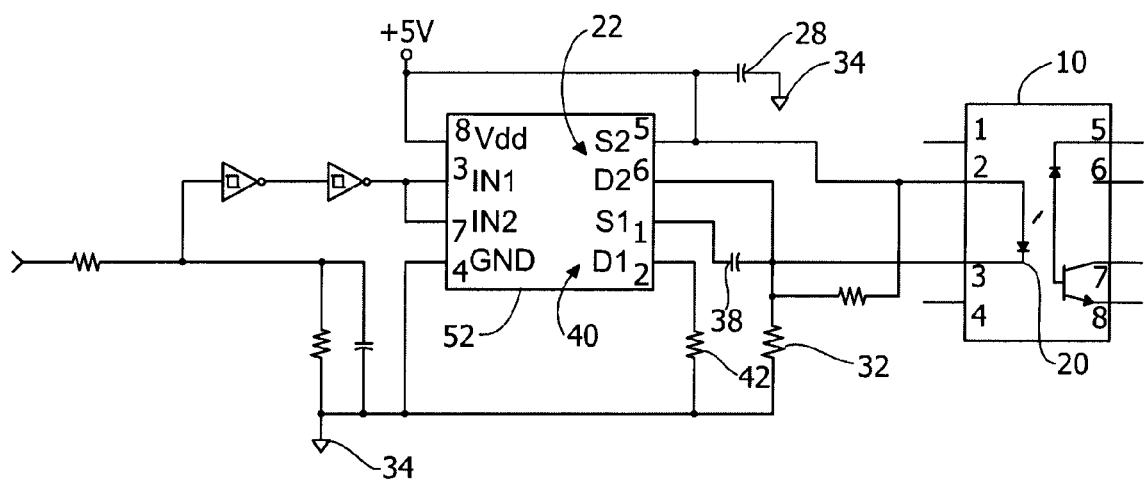
FIG. 6 shows an exemplary embodiment of the optocoupler in a gate driver board circuit of a VSD.

Referring next to FIG. 6, a gate driver board circuit 50 for use in a VSD illustrates an exemplary embodiment and implementation of optocoupler circuit 10 with series R-C circuit 44. In circuit 50, a complementary switches integrated circuit (IC) 52, e.g., <1ΩCMOS 1.8 V to 5.5 V, dual SPST switch, Model No. ADG823, manufactured by Analog Devices, Inc. Inc., of Norwood, Mass. is used. The switches in IC 52 may have very low on state resistance and are break-before-make type switches with delay as small as 32 nanoseconds (ηs). In alternate embodiments, other complementary switches ICs, e.g., CMOS low voltage 4Ω dual SPST switch, Model No. ADG723 manufactured by Analog Devices, Inc.; high-speed, low-voltage, 4Ω, dual SPST CMOS analog switch, Model No. MAX4643 manufactured by Maxim Integrated Products of Sunnyvale, Calif.; or other similar complementary switches ICs. In IC 52, a normally closed switch across pins 5 & 6 is connected across photo LED 20 of optocoupler circuit 10, and a normally open switch across pins 1 & 2 is connected between cathode capacitor 38 and limiting resistor 42. In at least one exemplary embodiment optocoupler circuit may be a single channel high-speed optocoupler Model No. HCNW4503, manufactured by Hewlett-Packard Company of Palo Alto, Calif., although the disclosure is not limited to any one optocoupler circuit, and other similar devices may be used. In at least one exemplary embodiment, series resistor 32 may be (169 ohm), limiting resistor 42 may be 15 ohm, decoupling capacitor 28 may be 0.1 uF and cathode capacitor 38 may be 0.1 uF.

It should be understood that the application is not limited to the details or methodology set forth in the following description or illustrated in the figures. It should also be understood that the phraseology and terminology employed herein is for the purpose of description only and should not be regarded as limiting.

While the exemplary embodiments illustrated in the figures and described herein are presently preferred, it should be understood that these embodiments are offered by way of example only. Accordingly, the present application is not limited to a particular embodiment.

It is important to note that the construction and arrangement of the optocoupler circuit as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the disclosure. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the disclosure, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

What is claimed is:

1. An optocoupler circuit comprising:
    a first switch, a photo Light Emitting Diode (LED), and a photo-detector, the first switch connected in parallel to the photo LED;
    an anode of the photo LED connected to the first switch, the first switch being arranged to activate the photo LED when the first switch is open; and
    the cathode of the photo LED connected to ground through a first resistor;
    the cathode of the photo LED also connected in series with a second switch, a capacitor and a second resistor to ground;
    wherein the first switch and the second switch are arranged to operate in complementary states to prevent the capacitor from discharging.

2. The optocoupler circuit of claim 1, wherein the first switch is arranged to shunt current flow from the photo LED to deactivate the photo LED.

3. The optocoupler circuit of claim 2, wherein a shunt current through the first switch flows through the first resistor to ground.

4. The optocoupler circuit of claim 1, further comprising the capacitor being directly connected to the cathode of the photo LED.

5. The optocoupler circuit of claim 4, further comprising the capacitor connected to the second switch in series with the second resistor, the second resistor arranged to limit current through the second switch flowing to ground.

6. The optocoupler circuit of claim 1, wherein the capacitor has a capacitance of about 0.1 micro-farad.

7. The optocoupler circuit of claim 6, wherein the second resistor has a resistance of about 15 ohm.

8. The optocoupler circuit of claim 1, wherein the complementary operating states of the first and second switches prevent repeated charging and discharging of the capacitor.

9. The optocoupler circuit of claim 1, wherein the capacitor charges during an initial activation of the photo LED when the first switch is open and the second switch is closed; and
the second resistor is arranged to limit a peak current flowing through the photo LED and the capacitor during the initial activation of the photo LED.

10. The optocoupler circuit of claim 1, wherein each of the first switch and the second switch is arranged to make before the other switch of the first and second switches breaks.

11. The optocoupler circuit of claim 10, wherein the second resistor has a resistance preselected to limit a peak current through first and second switches to a predetermined level, the predetermined level being within specified current ratings of the photo LED.

12. The optocoupler circuit of claim 1, wherein a current level through the photo LED is determined by a resistance value of the first resistor when the capacitor is charged.

13. The optocoupler of claim 1, wherein the capacitor comprises a low leakage current-type capacitor.

14. The optocoupler of claim 1, further comprising:
a decoupling capacitor connected to the anode of the photo LED and in parallel a power supply; the decoupling capacitor arranged to provide a shunt path to ground for induced currents to prevent accidental activation or deactivation of the photo LED.

15. The optocoupler of claim 14, wherein the decoupling capacitor comprises a capacitance value of about 0.1 microfarads (µf).

16. A gate driver circuit comprising:
a complementary switches integrated circuit comprising a first switch and a second switch, the first switch and second switch arranged to operate in complementary states; and
an optocoupler circuit, the optocoupler circuit comprising:
a photo light-emitting diode (LED) and a photo transistor;
an anode of the photo LED connected to the first switch arranged to activate the photo LED when the first switch is open; and
a cathode of the photo LED connected to ground through a first resistor;
the cathode of the photo LED also connected in series with a second switch, a capacitor and a second resistor to ground;
wherein the first switch and the second switch are arranged to operate in complementary states to prevent the capacitor from discharging.

17. The gate driver circuit of claim 16, wherein the complementary switches integrated circuit comprises a pair of break-before-make complementary switches, the complementary switches having an operational delay of about 32 nanoseconds.

18. The gate driver circuit of claim 16, wherein the optocoupler circuit comprises a single channel high-speed optocoupler.

19. The gate driver circuit of claim 16, the complementary switches further comprising: a normally closed switch and a normally open switch, the normally closed switch connected across the photo LED and the normally open switch connected between a cathode capacitor and a current limiting resistor.

20. The gate driver circuit of claim 16, further comprising a power supply, and the anode of the photo LED is connected to the power supply.

\* \* \* \* \*